(12) United States Patent
Kim et al.

(10) Patent No.: US 11,024,699 B2
(45) Date of Patent: Jun. 1, 2021

(54) DISPLAY DEVICE AND METHOD OF MANUFACTURING DISPLAY DEVICE

(71) Applicant: Samsung Display Co., Ltd., Yongin-Si (KR)

(72) Inventors: Tae Young Kim, Seongnam-si (KR);
Jongwoo Park, Seongnam-si (KR);
Youn Jae Jung, Suwon-si (KR);
Hyojung Kim, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/509,455

(22) Filed: Jul. 11, 2019

(65) Prior Publication Data
US 2020/0066826 A1    Feb. 27, 2020

(30) Foreign Application Priority Data

Aug. 27, 2018 (KR) .......................... 10-2018-0100626

(51) Int. Cl.
*H01L 27/32* (2006.01)
*H01L 51/52* (2006.01)
*H01L 51/50* (2006.01)

(52) U.S. Cl.
CPC ...... *H01L 27/3279* (2013.01); *H01L 51/5036* (2013.01); *H01L 51/5206* (2013.01); *H01L 51/5221* (2013.01); *H01L 2227/323* (2013.01)

(58) Field of Classification Search
CPC ...... G06F 3/044; G06F 3/0412; G06F 3/0416; G06F 2203/04103; G02F 1/1368; G02F 2201/123; G02F 1/136286; G02F 1/13338; G02F 1/134309; H01L 27/124; H01L 29/7869; H01L 27/3276; H01L 2227/323

USPC .......................................... 438/104; 313/504
See application file for complete search history.

(56) References Cited

U.S. PATENT DOCUMENTS

| 4,631,172 | A   | 12/1986 | Yamamoto et al. |
| 6,599,767 | B1  | 7/2003  | Li |
| 6,989,608 | B2  | 1/2006  | Rochette |
| 9,627,642 | B2* | 4/2017  | Hong ................ H01L 51/5253 |
| 2005/0024549 | A1* | 2/2005 | Gotoh ................ H01L 29/4908 349/43 |
| 2008/0128686 | A1 | 6/2008 | Kwon |

(Continued)

FOREIGN PATENT DOCUMENTS

KR  10-2010-0130850 A  12/2010
KR  10-2011-0107130 A   9/2011

(Continued)

OTHER PUBLICATIONS

"Effect of Copper Enrichment on the Electrochemical Potential of binary Al—Cu alloys", S. Garcia-Vergara et al., Journal of The Electrochemical Society, Dec. 9, 2003, 6 pages.

(Continued)

*Primary Examiner* — Jonathan Han
(74) *Attorney, Agent, or Firm* — Innovation Counsel LLP

(57) ABSTRACT

A display device may include an insulation layer, a wire directly contacting the insulation layer, a first electrode overlapping the insulation layer, an organic light emitting layer positioned on the first electrode, and a second electrode positioned on the organic light emitting layer. The wire may include an aluminum alloy that includes at least one of copper, vanadium, and silicon. The first electrode may include silver.

20 Claims, 9 Drawing Sheets

(56) References Cited

U.S. PATENT DOCUMENTS

| | | | |
|---|---|---|---|
| 2009/0140648 A1* | 6/2009 | Tohyama | H01L 51/56 313/505 |
| 2010/0301368 A1 | 12/2010 | Im et al. | |
| 2014/0191228 A1* | 7/2014 | Jung | H01L 29/78621 257/43 |

FOREIGN PATENT DOCUMENTS

| | | |
|---|---|---|
| KR | 10-1604895 B1 | 3/2016 |
| KR | 10-2016-0083992 A | 7/2016 |

OTHER PUBLICATIONS

"Electrical Resistivity of Ten Selected Binary Alloy Systems J. Phys. Chem. Ref. Data, vol. 12, No. 2", C.Y. Ho et al., Purdue University, 1983, 140 pages.

"Electrochemistry of Vanadium(II) and the Electrodeposition of Aluminumvanadium Alloys in the Aluminum Chloride-1-Ethyl-3-Methylimidazolium", T.Tsuda et al., Journal of Mining and Metallurgy, Feb. 12, 2003, 20 pages.

"Evaluation of corrosion resistance of aluminum-based alloys in bioethanol produced in misiones", Gustavo Raul Kramer et al., Procedia Materials Science 9, 2015, 9 pages.

"The Anodic behaviour of aluminum alloys in alkaline solutions", D.J. McPhail, University of Canterbury, Jan. 1993, 153 pages.

\* cited by examiner

DISPLAY DEVICE AND METHOD OF MANUFACTURING DISPLAY DEVICE

CROSS-REFERENCE TO RELATED APPLICATION(S)

This application claims priority under 35 USC § 119 to Korean Patent Application No. 10-2018-0100626, filed on Aug. 27, 2018 in the Korean Intellectual Property Office (KIPO); the entire disclosure of the Korean Patent Application is incorporated by reference herein.

BACKGROUND

1. Field

The technical field relates to a display device and a method of manufacturing the display device.

2. DESCRIPTION OF THE RELATED ART

A display device, such as an organic light emitting display device, may include an organic light emitting element formed in a display area and may include a wire formed in a peripheral area adjacent to the display area for transmitting a signal to the organic light emitting element. The organic light emitting element may include electrodes and an organic light emitting layer interposed between the electrodes.

When a conductive layer is etched to form an electrode of the organic light emitting element, the wire and the conductive layer may be subjected to galvanic corrosion. As a result, unwanted conductive particles may form on the wire, causing an undesirable short circuit between the wire and a neighboring conductive member. The short circuit may adversely affect the performance of the display device.

SUMMARY

Embodiments may be related to a display device including a wire that is not significantly corroded during an etching process of a conductive layer.

Embodiments may be related to a method of manufacturing a display device. In the method, corrosion of a wire may be minimized during etching of a conductive layer.

A display device according to embodiments may include a wire on a substrate, the wire including an aluminum (Al) alloy that includes any one of copper (Cu), vanadium (V), and silicon (Si), a first electrode on the wire, the first electrode including silver (Ag), an organic light emitting layer on the first electrode, and a second electrode on the organic light emitting layer.

In an embodiment, the wire may include an aluminum-copper alloy, and the aluminum-copper alloy may include copper of about 0.2 at % to about 3.0 at %.

In an embodiment, the wire may include an aluminum-copper alloy, and the aluminum-copper alloy may include copper of about 0.2 at % to about 1.0 at %.

In an embodiment, the wire may include an aluminum-vanadium alloy, and the aluminum-vanadium alloy may include vanadium of less than about 4.0 at %.

In an embodiment, the display device may further include a thin film transistor between the substrate and the first electrode, the thin film transistor including a semiconductor layer, a gate electrode, a source electrode, and a drain electrode.

In an embodiment, the wire may be on the same layer over the substrate as the source electrode and the drain electrode.

In an embodiment, the display device may further include a pad electrode integrally formed with the wire at an end of the wire.

In an embodiment, the wire may be on the same layer over the substrate as the source electrode, the drain electrode, and the pad electrode.

In an embodiment, the wire may include a first layer, a second layer, and a third layer which are sequentially stacked, the first layer and the third layer may include titanium (Ti), and the second layer may include an aluminum alloy.

In an embodiment, the first electrode may include a first layer, a second layer, and a third layer which are sequentially stacked, the first layer and the third layer may include indium tin oxide (ITO), and the second layer may include silver (Ag).

A display device according to embodiments may include a wire on a substrate, the wire including an aluminum (Al) alloy that includes at least one of indium (In), gallium (Ga), phosphorus (P), and thallium (Tl), a first electrode on the wire, the first electrode including silver (Ag), an organic light emitting layer on the first electrode, and a second electrode on the organic light emitting layer.

In an embodiment, the wire may include an aluminum-indium-gallium-phosphorus-thallium alloy, and the aluminum-indium-gallium-phosphorus-thallium alloy may include indium of about 0.1 at %, gallium of about 0.2 at %, phosphorus of about 0.1 at %, and thallium of about 0.01 at %.

A method of manufacturing a display device according to embodiments may include forming a wire on a substrate, the wire including an aluminum (Al) alloy that includes any one of copper (Cu), vanadium (V), and silicon (Si), forming a first electrode on the wire, the first electrode including silver (Ag), forming an organic light emitting layer on the first electrode, and forming a second electrode on the organic light emitting layer.

In an embodiment, the wire may include an aluminum-copper alloy, and the aluminum-copper alloy may include copper of about 0.2 at % to about 3.0 at %.

In an embodiment, the wire may include an aluminum-copper alloy, and the aluminum-copper alloy may include copper of about 0.2 at % to about 1.0 at %.

In an embodiment, the wire may include an aluminum-vanadium alloy, and the aluminum-vanadium alloy may include vanadium of less than about 4.0 at %.

In an embodiment, forming the first electrode may include forming a first electrode layer including silver on the wire, and etching a portion of the first electrode layer covering the wire by using an etchant.

In an embodiment, the first electrode layer may react with the etchant to form a silver ion ($Ag^+$), and the silver ion may be in contact with the wire.

In an embodiment, the wire may include a first layer, a second layer, and a third layer which are sequentially stacked, the first layer and the third layer may include titanium (Ti), and the second layer may include an aluminum alloy.

In an embodiment, the silver ion may be in contact with a side portion of the second layer of the wire.

An embodiment may be related to a display device. The display device may include an insulation layer, a wire directly contacting a face of the insulation layer, a first electrode overlapping the insulation layer, an organic light emitting layer positioned on the first electrode, and a second electrode positioned on the organic light emitting layer. The wire may be formed of or include an aluminum alloy that includes at least one of copper, vanadium, and silicon. The first electrode may be formed of or include silver.

The wire may include an aluminum-copper alloy. The aluminum-copper alloy may include copper in a range of 0.2 at % to 3.0 at %.

The wire may include an aluminum-copper alloy. The aluminum-copper alloy may include copper in a range of 0.2 at % to 1.0 at %.

The wire may include an aluminum-vanadium alloy. The aluminum-vanadium alloy may include vanadium of at most 4.0 at %.

The display device may include a thin film transistor electrically connected to the first electrode. The thin film transistor may include a semiconductor layer, a gate electrode, a source electrode, and a drain electrode.

The face of the insulation layer may directly contact each of the source electrode and the drain electrode.

The display device may include a pad electrode integrally formed with the wire at an end of the wire and wider than the wire in a width direction of the wire.

The face of the insulation layer may directly contact each of the source electrode, the drain electrode, and the pad electrode.

The wire may include a first layer, a second layer, and a third layer. The second layer may be positioned between the first layer and the third layer. The first layer and the third layer each may include titanium. The second layer may include the aluminum alloy.

The first electrode may include a first layer, a second layer, and a third layer. The second layer may be positioned between the first layer and the third layer. The first layer and the third layer each include indium tin oxide. The second layer may include the silver.

An embodiment may be related to a display device. The display device may include a substrate, a wire overlapping the substrate, a first electrode overlapping the substrate and electrically insulated from the wire, an organic light emitting layer positioned on the first electrode, and a second electrode positioned on the organic light emitting layer. The wire may include an aluminum alloy that includes at least one of indium, gallium, phosphorus, and thallium. The first electrode may include silver.

The wire may include an aluminum-indium-gallium-phosphorus-thallium alloy. The aluminum-indium-gallium-phosphorus-thallium alloy may include indium of at most 0.1 at %, gallium of at most 0.2 at %, phosphorus of at most 0.1 at %, and thallium of at most 0.01 at %.

An embodiment may be related to a method of manufacturing a display device. The method may include the following steps: forming a wire on a substrate, the wire including an aluminum alloy that includes at least one of copper, vanadium, and silicon; forming a first electrode on the substrate, the first electrode including silver; forming an organic light emitting layer on the first electrode; and forming a second electrode on the organic light emitting layer.

The wire may include an aluminum-copper alloy. The aluminum-copper alloy may include copper in a range of 0.2 at % to 3.0 at %.

The wire may include an aluminum-copper alloy. The aluminum-copper alloy may include copper in a range of 0.2 at % to 1.0 at %.

The wire may include an aluminum-vanadium alloy. The aluminum-vanadium alloy may include vanadium of at most 4.0 at %.

The forming the first electrode may include the following steps: forming a first electrode material layer including silver on a planarization layer; and etching a portion of the first electrode material layer using an etchant, wherein the planarization layer exposes the wire during the etching.

The first electrode material layer reacts with the etchant to form a silver ion. The silver ion may direct contact the wire.

The wire may include a first layer, a second layer, and a third layer. The second layer may be positioned between the first layer and the third layer. The first layer and the third layer each include titanium. The second layer may include the aluminum alloy.

The silver ion may directly contact a side portion of the second layer of the wire.

A display device according to embodiments may include a wire including an aluminum alloy, such that the wire may not be significantly corroded and/or a minimum amount of unwanted silver particles may be formed on the wire. Advantageously, an undesirable short circuit between adjacent wires may be prevented.

In a method of manufacturing a display device according to embodiments, a wire may be formed of an aluminum alloy, such that the wire may not be significantly corroded and/or a minimum amount of silver particles may be on the wire.

DETAILED DESCRIPTION OF THE EMBODIMENTS

Example embodiments are described with reference to the accompanying drawings. Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first,"

"second," etc. may represent "first-type (or first-set)," "second-type (or second-set)," etc., respectively.

The term "include" may mean "be formed of"; the term "contact" may mean "directly contact" or "direct contact"; the term "connect" may mean "electrically connect."

Figure 1:
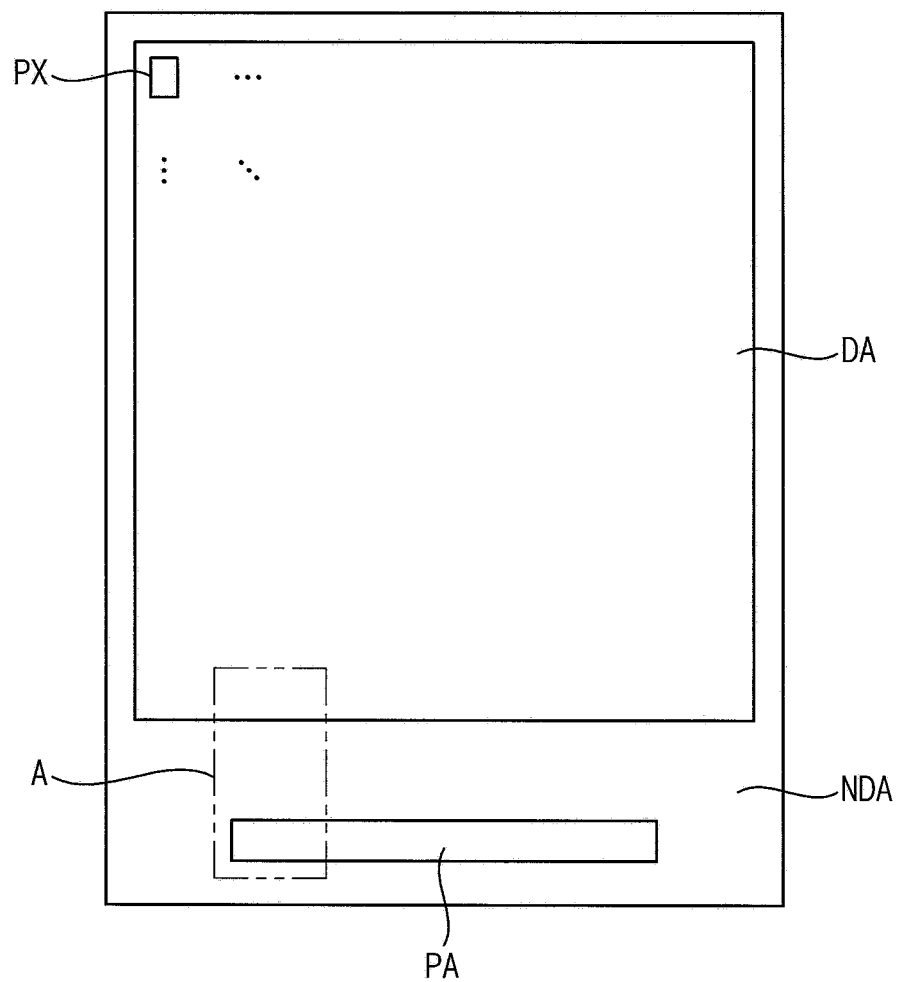
FIG. 1 is a plan view illustrating a display device according to an embodiment.

FIG. 1 is a plan view illustrating a display device according to an embodiment.

Referring to FIG. 1, the display device may include a display area DA and a non-display area NDA. A plurality of pixels PX may be disposed in the display area DA. The display area DA may display an image based on light emitted from each of the pixels PX.

The non-display area NDA may be adjacent to the display area DA. The non-display area NDA may be located on at least one side of the display area DA. For example, the non-display area NDA may surround the display area DA. The non-display area NDA may include a pad area PA in which a plurality of conductive pads may be disposed.

Figure 2:
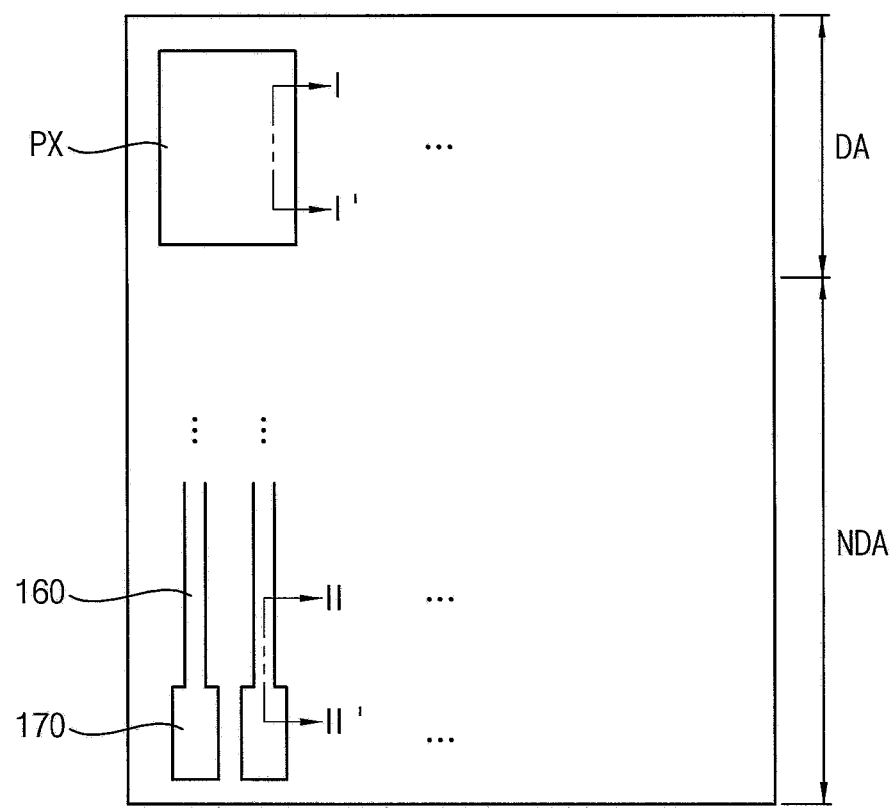
FIG. 2 is a plan view illustrating a display area and a non-display area of the display device in FIG. 1 according to an embodiment.
Figure 3:
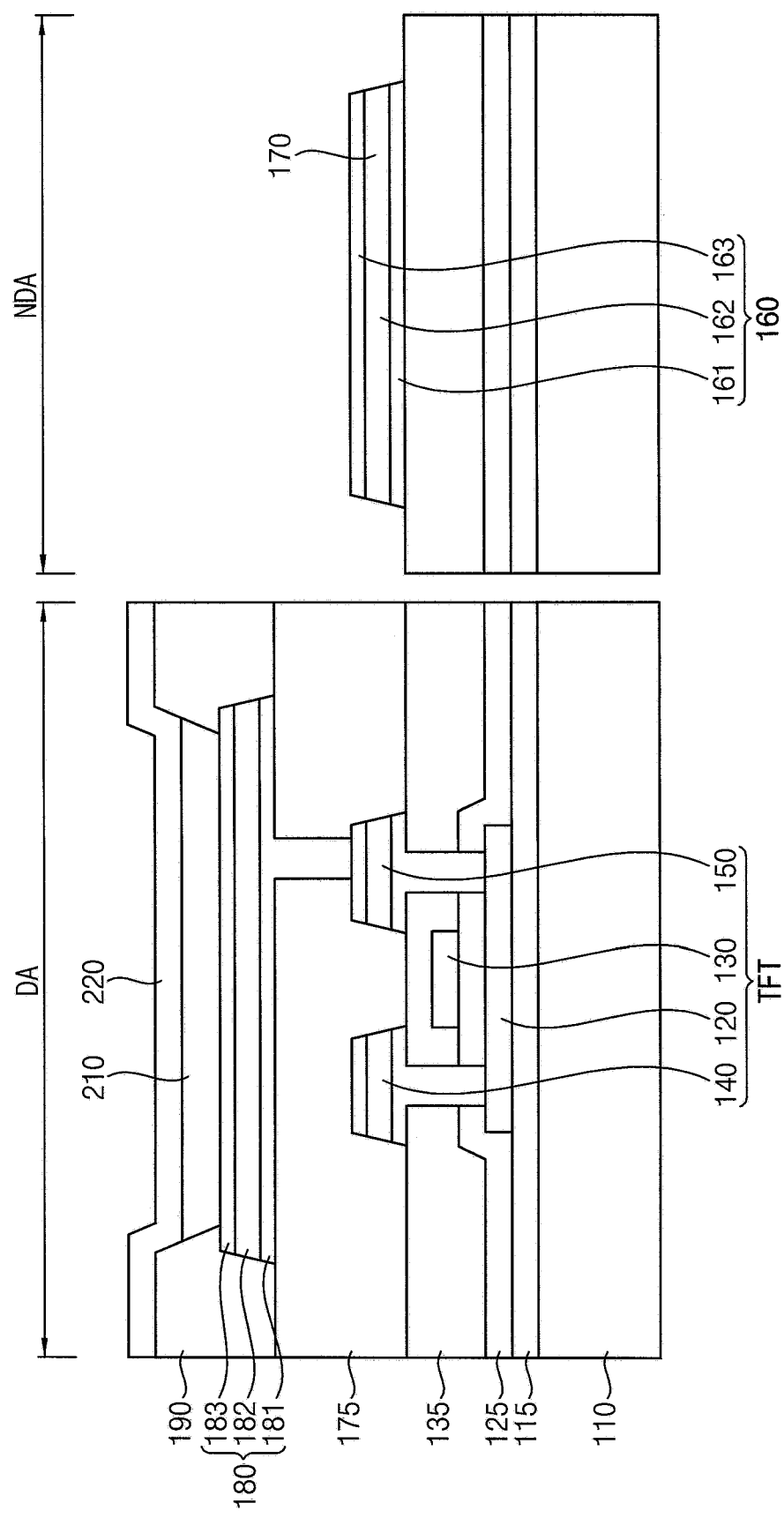
FIG. 3 is a cross-sectional view illustrating a display area and a non-display area of the display device in FIG. 1 according to an embodiment.

FIG. 2 is a plan view illustrating the display area DA and the non-display area NDA of the display device in FIG. 1 according to an embodiment. For example, FIG. 2 may illustrate an area A of the display device in FIG. 1. FIG. 3 is a cross-sectional view illustrating the display area DA and the non-display area NDA of the display device in FIG. 1 according to an embodiment. For example, FIG. 3 may be a cross-sectional view illustrating the display device in FIG. 2 taken along a line I-I' and a line II-II'.

Referring to FIGS. 2 and 3, the display device may include a substrate 110, a thin film transistor TFT, a wire 160, a pad electrode 170, a first electrode 180, an organic light emitting layer 210, and a second electrode 220.

The substrate 110 may be a transparent or opaque insulation substrate. For example, the substrate 110 may include glass or plastic such as at least one of polyimide (PI), polycarbonate (PC), polyethersulfone (PES), polyethylene terephthalate (PET), polyacrylate, etc.

A buffer layer 115 may be disposed on the substrate 110. The buffer layer 115 may be located in the display area DA and the non-display area NDA. The buffer layer 115 may block impurities such as oxygen, moisture, etc. from affecting the thin film transistor TFT. Further, the buffer layer 115 may provide a planarized surface over the substrate 110. The buffer layer 115 may include silicon nitride, silicon oxide, silicon oxynitride, or the like. In an embodiment, the buffer layer 115 may be unnecessary.

The thin film transistor TFT may be disposed on the buffer layer 115. The thin film transistor TFT may be located in the display area DA. The thin film transistor TFT may include a semiconductor layer 120, a gate electrode 130, a source electrode 140, and a drain electrode 150. In an embodiment, the thin film transistor TFT may have a top-gate structure in which the gate electrode 130 is above the semiconductor layer 120 with reference to the substrate 110. In an embodiment, the thin film transistor TFT may have a bottom-gate structure in which the gate electrode is below the semiconductor layer with reference to the substrate 110.

The semiconductor layer 120 may be disposed on the buffer layer 115. The semiconductor layer 120 may include amorphous silicon, polycrystalline silicon, oxide semiconductor, or the like. The semiconductor layer 120 may include a source area, a drain area, and a channel area formed between the source area and the drain area.

A gate insulation layer 125 covering the semiconductor layer 120 may be disposed on the buffer layer 115. The gate insulation layer 125 may be located in the display area DA and the non-display area NDA. The gate insulation layer 125 may insulate the gate electrode 130 from the semiconductor layer 120. The gate insulation layer 125 may include silicon nitride, silicon oxide, silicon oxynitride, or the like.

The gate electrode 130 may be disposed on the gate insulation layer 125. The gate electrode 130 may overlap the channel area of the semiconductor layer 120. The gate electrode 130 may include a metal such as at least one of molybdenum (Mo), aluminum (Al), copper (Cu), and an alloy.

An insulation interlayer 135 covering the gate electrode 130 may be disposed on the gate insulation layer 125. The insulation interlayer 135 may be located in the display area DA and the non-display area NDA. The insulation interlayer 135 may insulate the source electrode 140 and the drain electrode 150 from the gate electrode 130. The insulation interlayer 135 may include silicon nitride, silicon oxide, silicon oxynitride, or the like.

The source electrode 140 and the drain electrode 150 may be disposed on the insulation interlayer 135. The source electrode 140 and the drain electrode 150 may be connected to the source area and the drain area of the semiconductor layer 120, respectively, through contact holes formed in the insulation interlayer 135 and the gate insulation layer 125.

The wire 160 may be disposed on the insulation interlayer 135. The wire 160 may be located in the non-display area NDA.

In an embodiment, the wire 160 may be disposed on substantially the same layer over the substrate 110 as the source electrode 140 and the drain electrode 150. For example, the source electrode 140, the drain electrode 150, and the wire 160 may be disposed on and directly contact the same face of the insulation interlayer 135.

The pad electrode 170 may be disposed on the insulation interlayer 135. The pad electrode may be located in the non-display area NDA. The pad electrode 170 may be integrally formed with the wire 160 at an end of the wire 160 and formed of the same material(s) as the wire 160.

In an embodiment, the wire 160 may be disposed on substantially the same layer over the substrate 110 as the source electrode 140, the drain electrode 150, and the pad electrode 170. For example, the source electrode 140, the drain electrode 150, the wire 160, and the pad electrode 170 may be disposed on and directly contact the same face of the insulation interlayer 135.

The wire 160 may include an aluminum (Al) alloy. Since the wire 160 includes the aluminum alloy, the wire 160 may not be significantly corroded although silver ions (Ag$^+$) formed during an etching process for forming the first electrode 180 may directly contact the wire 160.

In an embodiment, the source electrode 140, the drain electrode 150, the wire 160, and the pad electrode 170 may include substantially the same material(s). In an embodiment, the source electrode 140, the drain electrode 150, and the pad electrode 170 may include the aluminum alloy like as the wire 160.

In embodiments, the aluminum alloy included in the wire 160 may include at least one of copper (Cu), vanadium (V), and silicon (Si).

In an embodiment, the wire 160 may include an aluminum-copper (Al—Cu) alloy.

A corrosion potential of silver (Ag) may be between about −0.2 V and about −0.1 V, and a corrosion potential of aluminum (Al) may be between about −1.0 V and about −0.8 V. When two materials having significantly different corrosion potentials are in contact with each other, a reaction between the two materials may rapidly progress, and significant corrosion of the materials may incur. For example, when aluminum is in contact with a silver ion (Ag$^+$), an aluminum particle may be oxidized such that an aluminum ion ($Al^{3+}$) may be formed, and the silver ion ($Ag^+$) may be reduced such that a silver particle may be formed. The aluminum may be significantly corroded because of the formation of the aluminum ion ($Al^{3+}$).

A corrosion potential of the aluminum-copper alloy may be greater than the corrosion potential of aluminum, therefore, a difference between the corrosion potentials of the aluminum-copper alloy and silver may be less than a difference between the corrosion potentials of aluminum and silver. Accordingly, although the wire 160 including the aluminum-copper alloy is in contact with the silver ion ($Ag^+$), a reaction may not be substantial or may be slow. Therefore, corrosion of the wire 160 may be substantially prevented or minimized.

Figure 4:
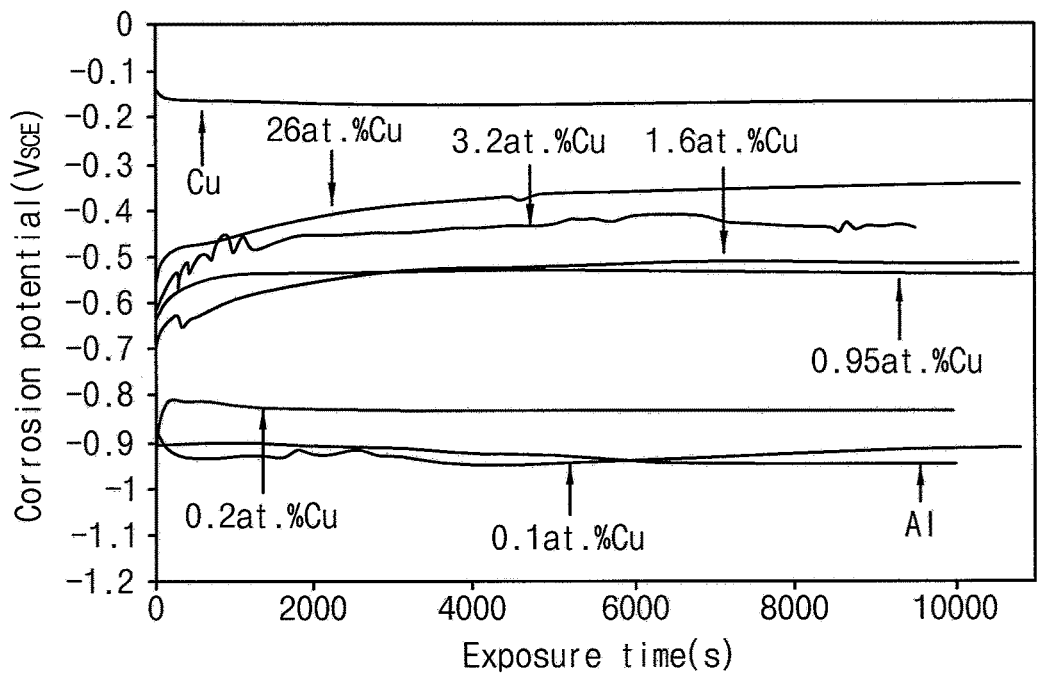
FIG. 4 is a graph illustrating a corrosion potential of an aluminum-copper alloy according to a copper content according to embodiments.
Figure 5:
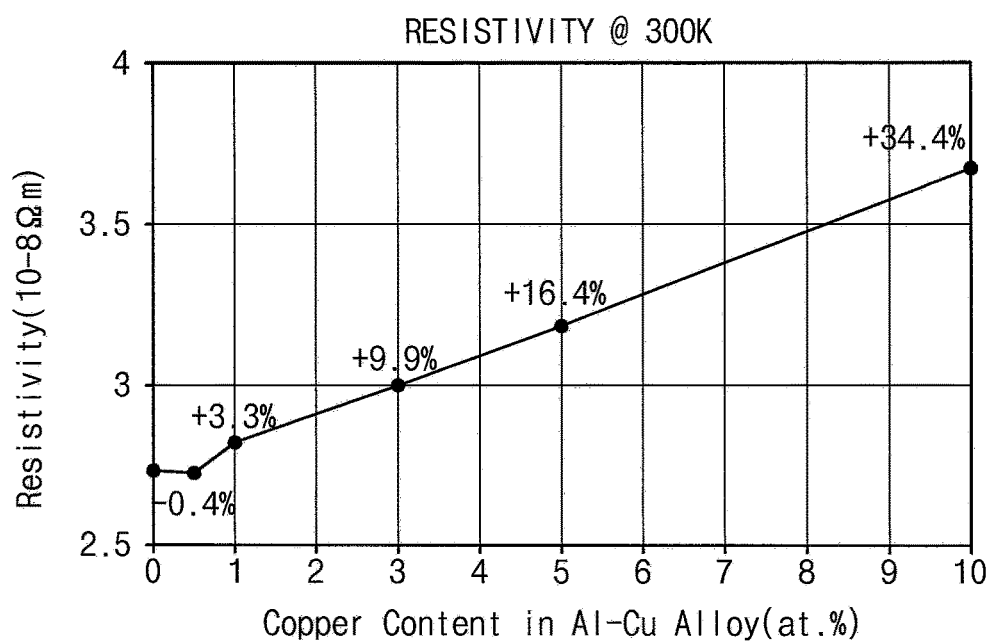
FIG. 5 is a graph illustrating a resistivity of an aluminum-copper alloy according to a copper content according to embodiments.
Figure 6:
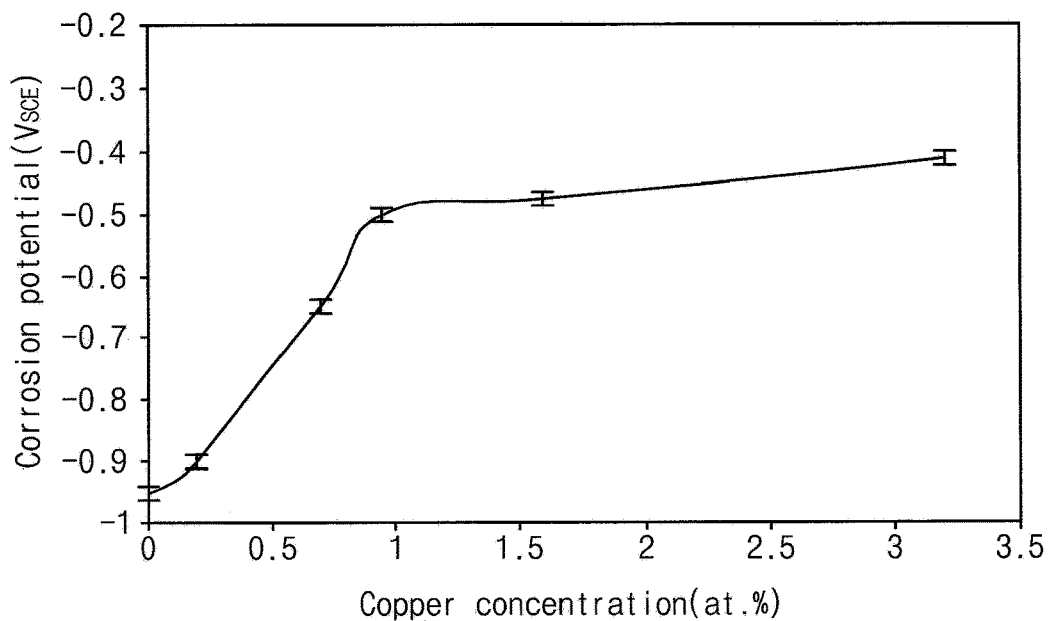
FIG. 6 is a graph illustrating a corrosion potential of an aluminum-copper alloy according to a copper content according to embodiments.

FIG. 4 is a graph illustrating a corrosion potential of the aluminum-copper alloy according to a copper content according to embodiments. FIG. 5 is a graph illustrating a resistivity of the aluminum-copper alloy according to a copper content according to embodiments. FIG. 6 is a graph illustrating a corrosion potential of the aluminum-copper alloy according to a copper content according to embodiments.

In an embodiment, the aluminum-copper alloy included in the wire 160 may include copper in a range of about 0.2 at % to about 3.0 at %.

Referring to FIG. 4, a corrosion potential of the aluminum-copper alloy may increase when a copper content of the aluminum-copper alloy increases. If the aluminum-copper alloy has a copper content less than about 0.2 at %, the corrosion potential of the aluminum-copper alloy may only slightly increase with respect to a corrosion potential of aluminum. Therefore, when the aluminum-copper alloy is in contact with a silver ion ($Ag^+$), the aluminum-copper alloy may be corroded. If the aluminum-copper alloy has a copper content greater than about 0.2 at %, the corrosion potential of the aluminum-copper alloy may significantly increase with respect to the corrosion potential of aluminum. Therefore, when the aluminum-copper alloy is in contact with the silver ion ($Ag^+$), the aluminum-copper alloy may not be substantially corroded. According to an embodiment, the copper content of the aluminum-copper alloy included in the wire 160 may be at least about 0.2 at % such that corrosion of the wire 160 may be substantially prevented or minimized.

Referring to FIG. 5, resistivity of the aluminum-copper alloy may increase when a copper content of the aluminum-copper alloy increases. This is because resistivity of copper is greater than resistivity of aluminum. A signal transmitted through a wire may be delayed if resistivity of the wire increases. A thickness of the wire may need to be increased in order to prevent an increase of the resistance of the wire. If the increase of the resistance of the wire is greater than about 10%, the wire may not be appropriate for use to transmit a signal. According to an embodiment, the copper content of the aluminum-copper alloy included in the wire 160 may be at most about 3.0 at % such that a significant increase of the resistivity of the wire 160 may be prevented.

In an embodiment, the aluminum-copper alloy included in the wire 160 may include copper in a range of about 0.2 at % to about 1.0 at %, for minimum corrosion and sufficient conductivity.

Referring to FIG. 6, an amount of increase of a corrosion potential of the aluminum-copper alloy relative to an amount of increase of a copper content of the aluminum-copper alloy may vary. When the copper content of the aluminum-copper alloy is less than about 1.0 at %, a slope of the amount of increase of the corrosion potential of the aluminum-copper alloy relative to the amount of increase of the copper content of the aluminum-copper alloy may be relatively large. When the copper content of the aluminum-copper alloy is greater than about 1.0 at %, a slope of the amount of increase of the corrosion potential of the aluminum-copper alloy relative to the amount of increase of the copper content of the aluminum-copper alloy may be relatively small. Referring to FIG. 5 and FIG. 6, when the copper content of the aluminum-copper alloy is greater than about 1.0 at %, the resistivity may significantly increase but the corrosion potential may not significantly increase as the copper content of the aluminum-copper alloy increases. According to an embodiment, the copper content of the aluminum-copper alloy included in the wire 160 may be in a range of about 0.2 at % to about 1.0 at %, such that corrosion of the wire 160 may be substantially prevented or minimized, and a significant increase of the resistivity of the wire 160 may be prevented.

In an embodiment, the wire 160 may include an aluminum-vanadium (Al—V) alloy.

A corrosion potential of the aluminum-vanadium alloy may be greater than a corrosion potential of aluminum; therefore, a difference between the corrosion potentials of the aluminum-vanadium alloy and silver may be less than a difference between the corrosion potentials of aluminum and silver. Accordingly, although the wire 160 including the aluminum-vanadium alloy is in contact with a silver ion ($Ag^+$), a reaction may not be substantial occur or may be slow. Therefore, corrosion of the wire 160 may be substantially prevented or minimized.

Figure 7:
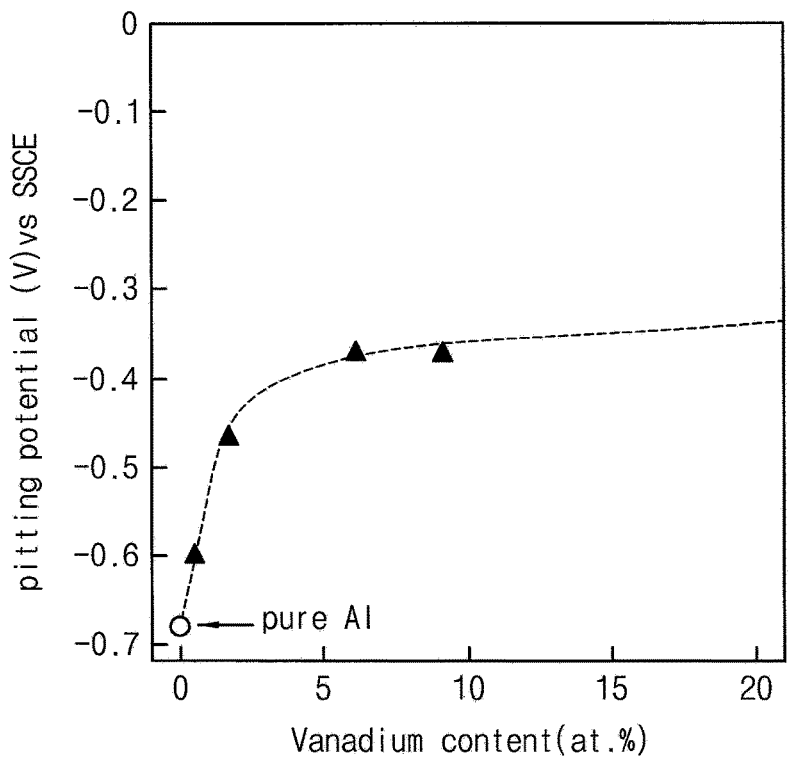
FIG. 7 is a graph illustrating a pitting potential of an aluminum-vanadium alloy according to a vanadium content according to an embodiment.

FIG. 7 is a graph illustrating a pitting potential of the aluminum-vanadium alloy according to a vanadium content according to embodiments.

In an embodiment, the aluminum-vanadium alloy included in the wire 160 may include vanadium of at most about 4.0 at %.

Referring to FIG. 7, an amount of increase of a pitting potential of the aluminum-vanadium alloy relative to an amount of increase of a vanadium content of the aluminum-vanadium alloy may vary. When the vanadium content of the aluminum-vanadium alloy is less than about 4.0 at %, a slope of the amount of increase of the pitting potential of the aluminum-vanadium alloy relative to the amount of increase of the vanadium content of the aluminum-vanadium alloy may be relatively large. When the vanadium content of the aluminum-vanadium alloy is greater than about 4.0 at %, a slope of the amount of increase of the pitting potential of the aluminum-vanadium alloy relative to the amount of increase of the vanadium content of the aluminum-vanadium alloy may be relatively small. Therefore, when the vanadium content of the aluminum-vanadium alloy is greater than about 4.0 at %, the pitting potential may not significantly increase. According to an embodiment, the vanadium content of the aluminum-vanadium alloy included in the wire 160 may be at most about 4.0 at % such that corrosion of the wire 160 may be substantially prevented or minimized without undesirably causing a significant increase of resistivity of the wire 160.

In still an embodiment, the wire 160 may include an aluminum-silicon (Al—Si) alloy.

A corrosion potential of the aluminum-silicon alloy may be greater than a corrosion potential of aluminum, therefore, a difference between the corrosion potentials of the aluminum-silicon alloy and silver may be less than a difference between the corrosion potentials of aluminum and silver. Accordingly, although the wire 160 including the aluminum-silicon alloy is in contact with a silver ion (Ag$^+$), a reaction may not be substantial or may be slow. Therefore, corrosion of the wire 160 may be substantially prevented or minimized.

In embodiments, the aluminum alloy included in the wire 160 may include at least one of indium (In), gallium (Ga), phosphorus (P), and thallium (Tl).

In an embodiment, the wire 160 may include an aluminum-indium-gallium-phosphorus-thallium (Al—In—Ga—P—Tl) alloy.

In an embodiment, the aluminum-indium-gallium-phosphorus-thallium alloy included in the wire 160 may include indium of at most about 0.1 at %, gallium of at most about 0.2 at %, phosphorus of at most about 0.1 at %, and thallium of at most about 0.01 at %.

Table 1 below illustrates a corrosion rate of aluminum and a corrosion rate of the aluminum-indium-gallium-phosphorus-thallium alloy.

TABLE 1

|  | corrosion rate (mg/cm$^2$/min) | corrosion rate (mm/yr) |
| --- | --- | --- |
| Al | 0.515 | 1002 |
| Al—0.1%In—0.2%Ga—0.1%P—0.01%Tl | 0.058 | 113 |

As illustrated in Table 1, a corrosion rate of the aluminum-indium-gallium-phosphorus-thallium alloy may be less than a corrosion rate of aluminum. For example, when the aluminum-indium-gallium-phosphorus-thallium alloy includes indium of about 0.1 at %, gallium of about 0.2 at % phosphorus of about 0.1 at %, thallium of about 0.01 at %, the corrosion rate of the aluminum-indium-gallium-phosphorus-thallium alloy may be about 1/10 of the corrosion rate of aluminum. Although the wire 160 including the aluminum-indium-gallium-phosphorus-thallium alloy is in contact with a silver ion (Ag$^+$), a reaction may be slow. Therefore, corrosion of the wire 160 may be substantially prevented or minimized. The content of each of indium, gallium, phosphorus, and thallium in the alloy is configured to ensure desirable conductivity of the wire 160.

Referring to FIG. 3, the wire 160 may include a first layer 161, a second layer 162, and a third layer 163 which are sequentially stacked. For example, the first layer 161 may be disposed on a lower surface of the second layer 162, and the third layer 163 may be disposed on an upper surface of the second layer 162.

The first layer 161, the second layer 162, and the third layer 163 of the wire 160 may include titanium (Ti), an aluminum alloy, and titanium, respectively. The second layer 162 of the wire 160 may serve as a main wire layer, the first layer 161 and the third layer 163 of the wire 160 may serve as auxiliary wire layers protecting the lower surface and the upper surface of the second layer 162, respectively.

A planarization layer 175 covering the source electrode 140 and the drain electrode 150 may be disposed on the insulation interlayer 135. The planarization layer 175 may be located in the display area DA. The wire 160 and the pad electrode 170 may not be covered by the planarization layer 175. The planarization layer 175 may provide a planarized surface above the thin film transistor TFT. The planarization layer 175 may include an organic material such as acryl-based resin, epoxy-based resin, polyimide-based resin, polyester-based resin, or the like.

The first electrode 180 may be disposed on the planarization layer 175. The first electrode 180 may be located in the display area DA. The first electrode 180 may be connected to the drain electrode 150 of the thin film transistor TFT through a contact hole formed in the planarization layer 175.

The first electrode 180 may include silver (Ag). In an etching process for forming the first electrode 180, silver included in the first electrode 180 may react to an etchant, such that a silver ion (Ag$^+$) may be formed. The silver ion (Ag$^+$) may be in contact with the wire 160 that is not covered by the planarization layer 175.

In an embodiment, the first electrode 180 may include a first layer 181, a second layer 182, and a third layer 183 which are sequentially stacked. For example, the first layer 181 may be disposed on a lower surface of the second layer 182, and the third layer 183 may be disposed on an upper surface of the second layer 182.

The first layer 181, the second layer 182, and the third layer 183 of the first electrode 180 may include indium tin oxide (ITO), silver, and indium tin oxide, respectively. The second layer 182 of the first electrode 180 may serve as a main electrode layer, the first layer 181 and the third layer 183 of the first electrode 180 may serve as auxiliary electrode layers protecting the lower surface and the upper surface of the second layer 182, respectively.

A pixel defining layer 190 partially covering the first electrode 180 may be disposed on the planarization layer 175. The pixel defining layer 190 may be located in the display area DA. The pixel defining layer 190 may insulate the second electrode 220 from the first electrode 190. The pixel defining layer 190 may include an opening that exposes an upper surface portion of the first electrode 190 to define an emission area. The pixel defining layer 190 may include an organic material such as acryl-based resin, epoxy-based resin, polyimide-based resin, polyester-based resin, or the like.

The organic light emitting layer 210 may be disposed on the first electrode 180. The organic light emitting layer 210 may be located in the display area DA. The organic light emitting layer 210 may include a low molecular organic compound or a high molecular organic compound.

In an embodiment, the organic light emitting layer 210 may emit red light, green light, or blue light. In an embodiment, the organic light emitting layer 210 may emits white light; the organic light emitting layer 210 may have a multi-layered structure including a red light emitting layer, a green light emitting layer, and a blue light emitting layer, or may have a single-layered structure including red light emitting material, green light emitting material, and blue light emitting material.

The second electrode 220 may be disposed on the organic light emitting layer 210. The second electrode 220 may be disposed on the pixel defining layer 190 and may cover the organic light emitting layer 210. The second electrode 220 may include at least one of lithium (Li), calcium (Ca), lithium fluoride (LiF), aluminum (Al), and magnesium (Mg).

FIGS. 8, 9, 10, and 11 are cross-sectional views illustrating structures formed in a method of manufacturing a display device according to an embodiment.

Figure 8:
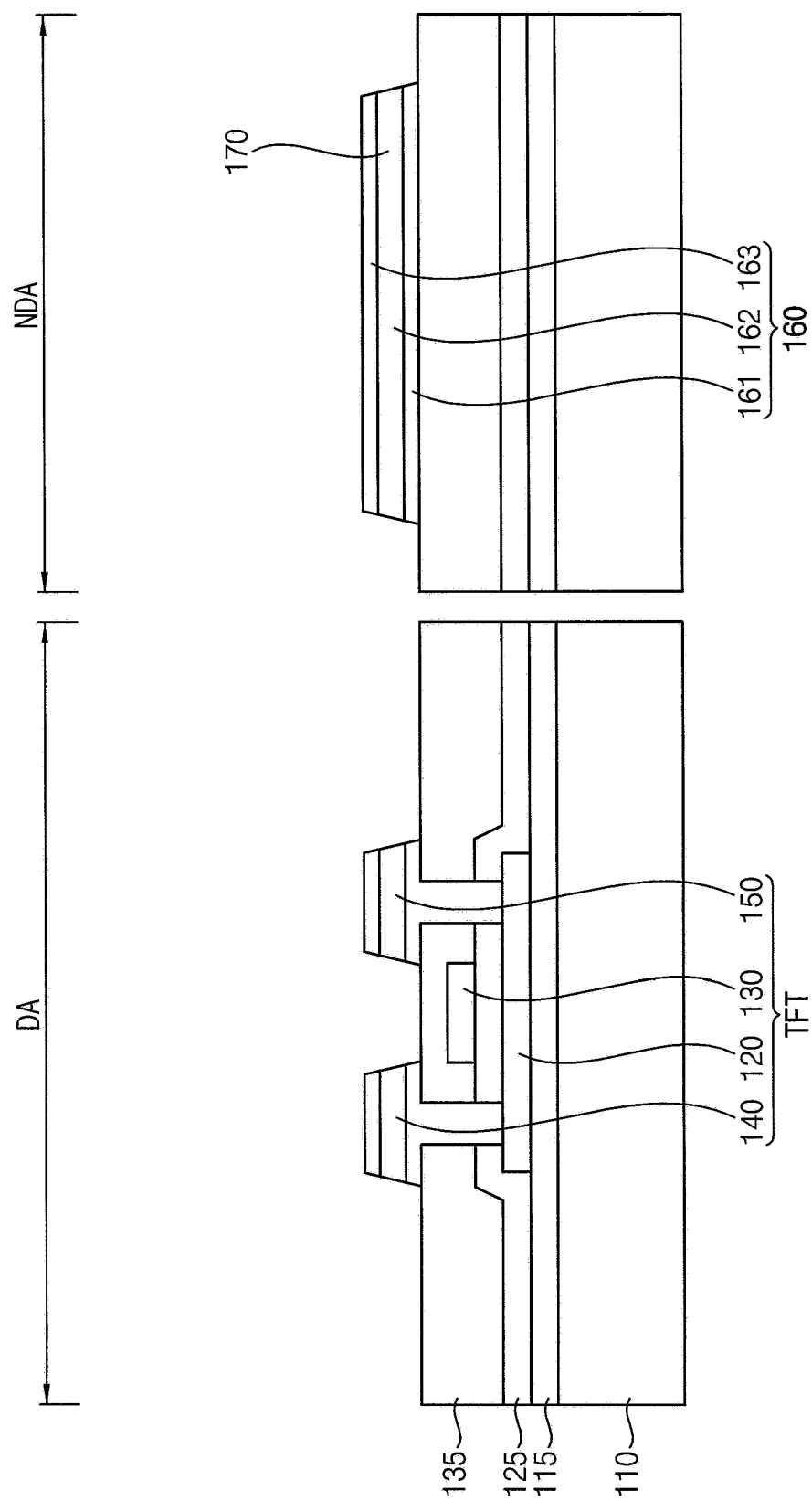
FIG. 8, FIG. 9, FIG. 10, and FIG. 11 are cross-sectional views illustrating structures formed in a method of manufacturing a display device according to an embodiment.

Referring to FIG. 8, the thin film transistor TFT, the wire 160, and the pad electrode 170 may be formed on the substrate 110.

The buffer layer 115 may be formed on the substrate 110 in the display area DA and the non-display area NDA. For example, the buffer layer 115 may be formed of at least one of silicon oxide, silicon nitride, silicon oxynitride, etc., using chemical vapor deposition, sputtering, or the like.

Subsequently, the semiconductor layer 120 may be formed on the buffer layer 115 in the display area DA. For example, a material layer including at least one of silicon, oxide semiconductor, etc. may be formed on an entire surface of the buffer layer 115 and then patterned to form the semiconductor layer 120. In an embodiment, an amorphous silicon layer may be formed on the entire surface of the buffer layer 115 and then crystallized to form a polycrystalline silicon layer. The polycrystalline silicon layer may be patterned, and impurities may be doped at opposite ends of the patterned polycrystalline silicon layer to form the semiconductor layer 120 including the source area, the drain area, and the channel area inbetween.

Subsequently, the gate insulation layer 125 covering the semiconductor layer 120 may be formed on the buffer layer 115 in the display area DA and the non-display area NDA. For example, the gate insulation layer 125 may be formed of at least one of silicon oxide, silicon nitride, silicon oxynitride, etc.

Subsequently, the gate electrode 130 may be formed on the gate insulation layer 125 in the display area DA. The gate electrode 130 may overlap the semiconductor layer 120. For example, the gate electrode 130 may be formed of a metal or an alloy.

Subsequently, the insulation interlayer 135 covering the gate electrode 130 may be formed on the gate insulation layer 125 in the display area DA and the non-display area NDA. For example, the insulation interlayer 135 may be formed of at least one of silicon oxide, silicon nitride, silicon oxynitride, etc.

Subsequently, the contact holes exposing portions of the semiconductor layer 120 may be formed in the insulation interlayer 135 and the gate insulation layer 125. For example, the contact holes may expose the source area and the drain area of the semiconductor layer 120, respectively.

Subsequently, the source electrode 140 and the drain electrode 150 may be formed on the insulation interlayer 135 in the display area DA, and the wire 160 and the pad electrode 170 may be formed on the insulation interlayer 135 in the non-display area NDA. For example, a conductive layer may be formed on an entire surface of the insulation interlayer 135 and then patterned to substantially simultaneously form the source electrode 140, the drain electrode 150, the wire 160, and the pad electrode 170.

The wire 160 may be formed of or include an aluminum (Al) alloy. The wire 160 may include the aluminum alloy such that the wire 160 may not be significantly corroded although the wire 160 is in contact with a silver ion (Ag$^+$) during an etching process of forming the first electrode 180.

In an embodiment, the aluminum alloy included in the wire 160 may include at least one of copper (Cu), vanadium (V), and silicon (Si). For example, the wire 160 may include an aluminum-copper (Al—Cu) alloy, an aluminum-vanadium (Al—V) alloy, or an aluminum-silicon (Al—Si) alloy.

In an embodiment, the aluminum alloy included in the wire 160 may include at least one of indium (In), gallium (Ga), phosphorus (P), and thallium (Tl). For example, the wire 160 may include an aluminum-indium-gallium-phosphorus-thallium (Al—In—Ga—P—Tl) alloy.

In an embodiment, the wire 160 may include the first layer 161, the second layer 162, and the third layer 163 which are sequentially stacked. For example, a layer including titanium (Ti), a layer including an aluminum alloy, and a layer including titanium may be sequentially formed on the insulation interlayer 135 and then patterned to form the source electrode 140, the drain electrode 150, the wire 160, and the pad electrode 170 each having a stacked structure of Ti—Al alloy-Ti.

Figure 9:
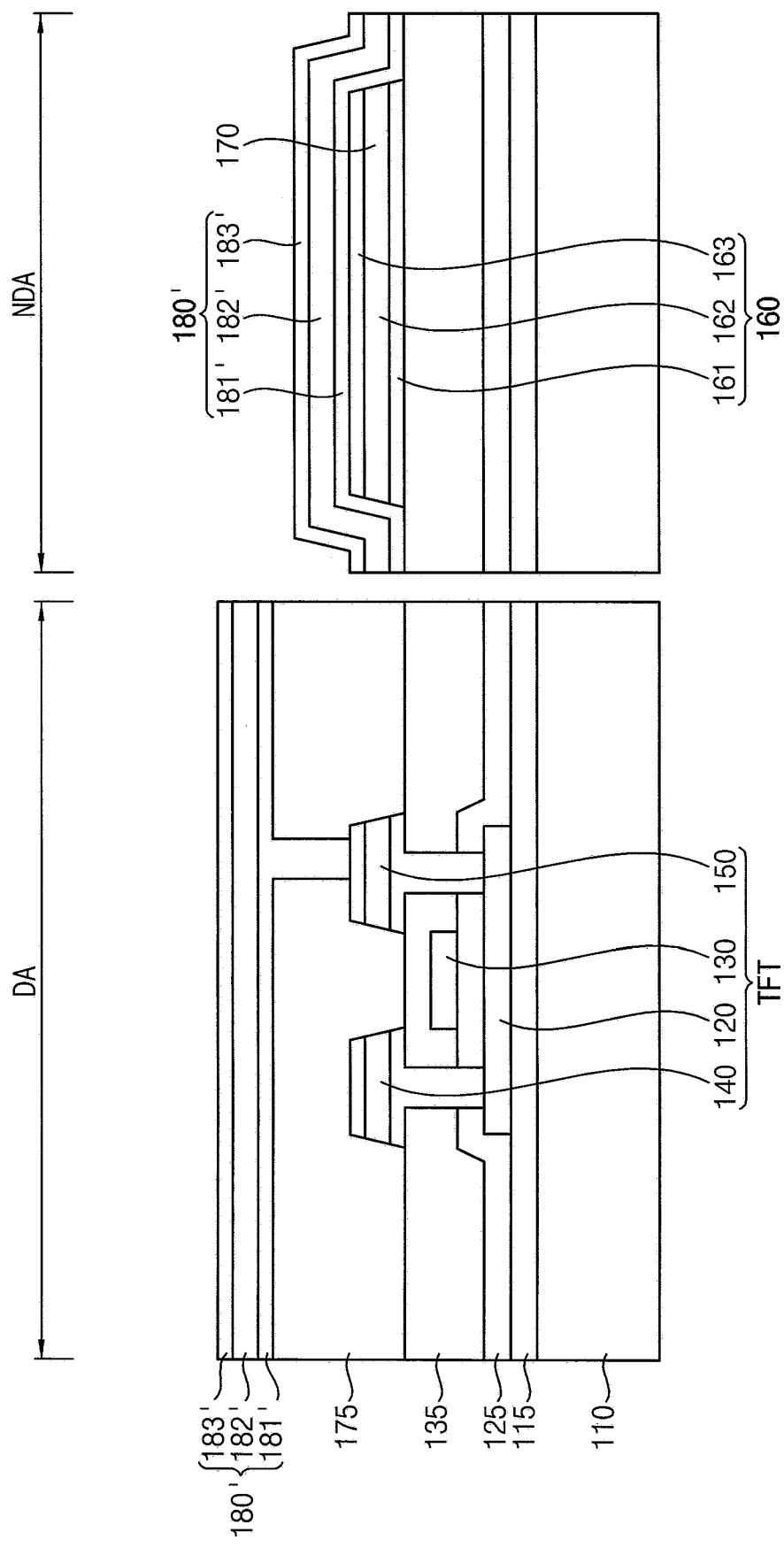
Figure 10:
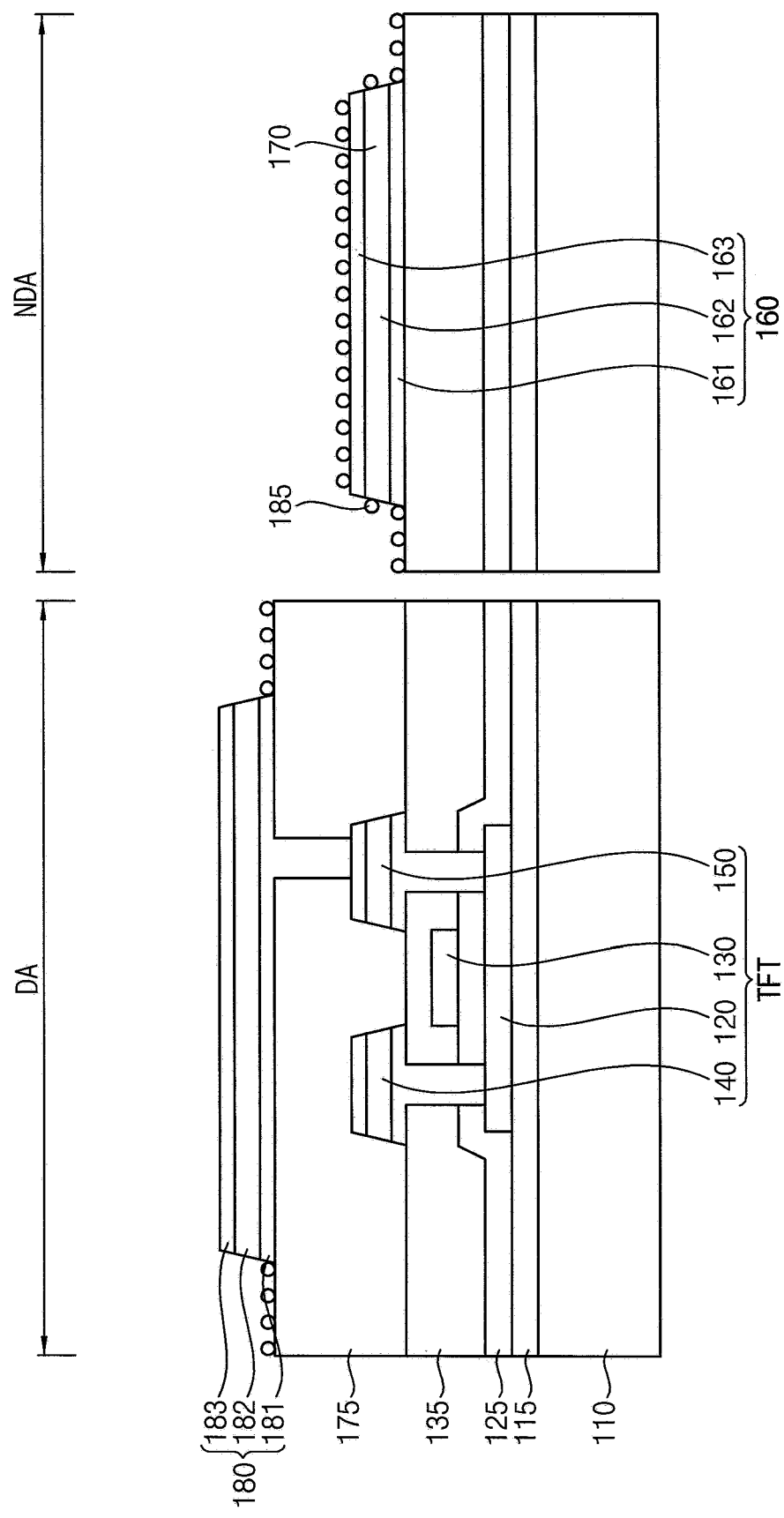
Figure 11:
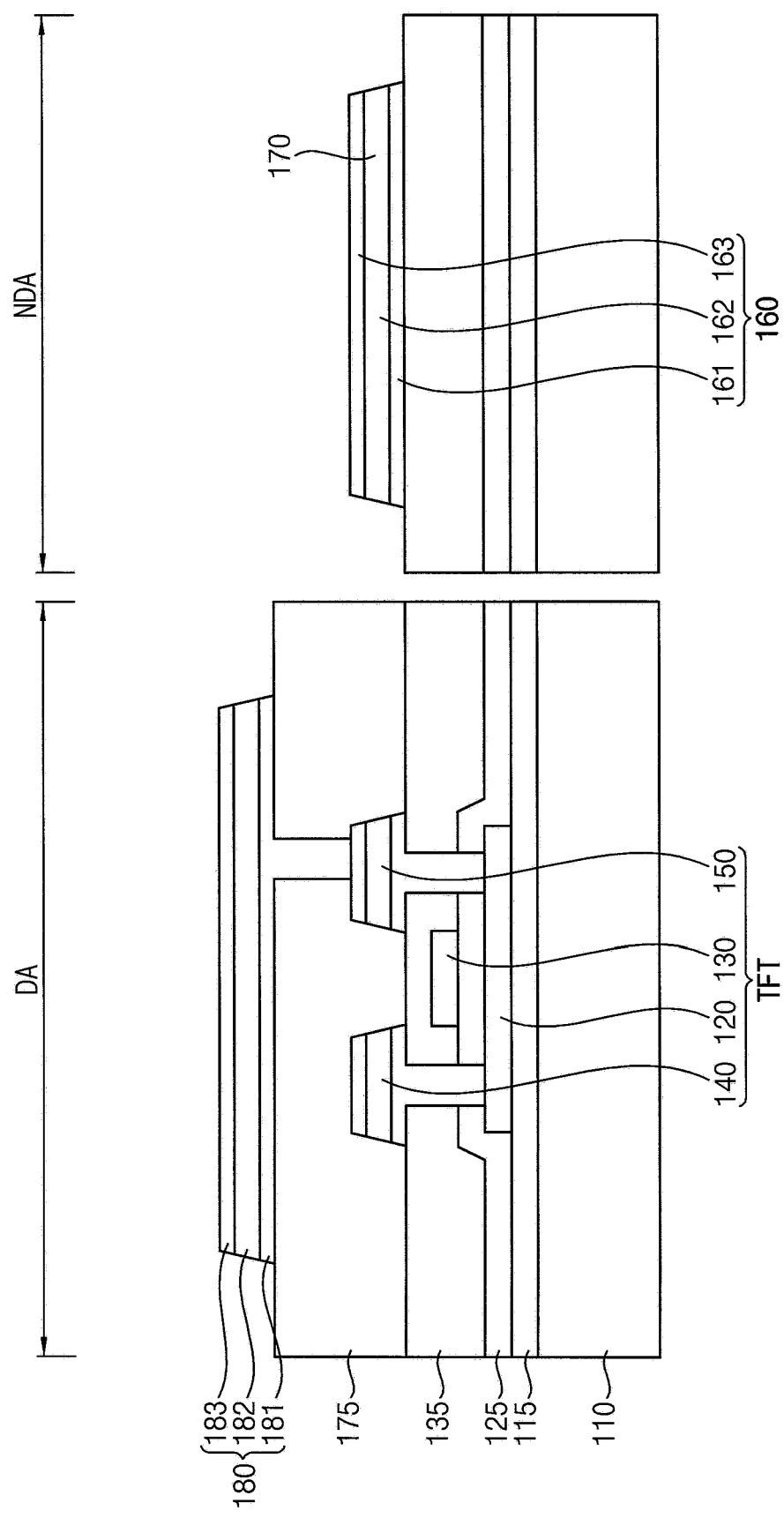

Referring to FIGS. 9, 10, and 11, the first electrode 180 may be formed on the source electrode 140 and the drain electrode 150 and above, the wire 160 and the pad electrode 170.

Referring to FIG. 9, the planarization layer 175 covering the source electrode 140 and the drain electrode 150 may be formed on the insulation interlayer 135 in the display area DA. The planarization layer 175 may not cover the wire 160 and the pad electrode 170. For example, the planarization layer 175 may be formed of at least one of polyimide-based resin, photoresist, acryl-based resin, polyamide-based resin, siloxane-based resin, etc. The contact hole exposing a portion of the drain electrode 150 may be formed in the planarization layer 175.

Subsequently, a first electrode material layer 180' may be formed on the planarization layer 175 in the display area DA and on the insulation interlayer 135 and the wire 160 in the non-display area NDA. The first electrode material layer 180' may be formed of silver (Ag) using at least one of chemical vapor deposition, sputtering, etc.

The first electrode material layer 180' may be formed with a substantially uniform thickness along a profile of the planarization layer 175, the insulation interlayer 135, the wire 160, and the pad electrode 170. The first electrode material layer 180' may be in contact with the drain electrode 150 in the display area DA, and may be in contact with the wire 160 and the pad electrode 170 in the non-display area NDA.

In an embodiment, the first electrode material layer 180' may include a first layer 181', a second layer 182', and a third layer 183' which are sequentially stacked. For example, a layer including indium tin oxide (ITO), a layer including silver, and a layer including indium tin oxide may be sequentially deposited to form the first electrode material layer 180' having a stacked structure of ITO-Ag-ITO.

Subsequently, referring to FIG. 10, a portion of first electrode material layer 180' which covers the wire 160 and the pad electrode 170 may be etched away. For example, a photoresist pattern may be formed on a region of the first electrode material layer 180' in which the first electrode 180 will be formed, and the first electrode material layer 180' may be etched using the photoresist pattern as a mask and using an etchant.

Silver ions (Ag$^+$) 185 may be formed when the first electrode material layer 180' including silver reacts to the etchant. For example, the etchant may include nitric acid (HNO$_3$). Silver included in the first electrode layer 180' may react to the nitric acid included in the etchant, such that silver ions 185 may be formed according to chemical formula 1 below.

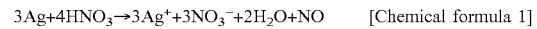

$$3Ag + 4HNO_3 \rightarrow 3Ag^+ + 3NO_3^- + 2H_2O + NO \quad \text{[Chemical formula 1]}$$

The silver ions 185 may be in contact with the wire 160. For example, the silver ions 185 may be in contact with a side portion of the second layer 162 of the wire 160 including an aluminum alloy.

If the wire includes only aluminum, when the silver ions (Ag$^+$) are in contact with the wire, aluminum included in the wire may react to the silver ions (Ag$^+$), such that silver particles may be formed. If the silver particles are formed between adjacent wires, the wires may be undesirably short-circuited. As a result, the performance of the display device may be adversely affected, and/or the display device may be damaged.

In a method of manufacturing the display device according to an embodiment, the wire 160 may be formed of or include an aluminum alloy, such that corrosion of the wire 160 may be substantially prevented or minimized. Although the wire 160 is in contact with the silver ions 185, a reaction may not be substantial or may be slow. Advantageously, unwanted short circuit may be prevented.

Referring to FIG. 11, silver ions 185 remaining on the insulation interlayer 135, the wire 160, the pad electrode 170, and the planarization layer 175 may be removed. For example, the silver ions 185 may be removed by a cleaning process together with etchant remaining on the substrate 110.

Referring to FIG. 3, the pixel defining layer 190 partially covering the first electrode 180 may be formed on the planarization layer 175 in the display area DA. For example, the pixel defining layer 190 may be formed of at least one of polyimide-based resin, photoresist, acryl-based resin, polyamide-based resin, siloxane-based resin, etc. The opening exposing the upper surface of the first electrode 180 may be formed in the pixel defining layer 190.

The organic light emitting layer 210 may be formed on the first electrode 180. The organic light emitting layer 210 may be formed in the opening of the pixel defining layer 190. For example, the organic light emitting layer 210 may be formed of a low molecular organic compound or a high molecular organic compound using screen printing, inkjet printing, deposition, or the like.

The second electrode 220 may be formed on the pixel defining layer 190 and the organic light emitting layer 210. For example, the second electrode 220 may be formed of at least one of lithium (Li), calcium (Ca), lithium fluoride (LiF), aluminum (Al), magnesium (Mg), etc.

The display device according to the embodiments may be included in a computer, a notebook, a mobile phone, a smartphone, a smart pad, a PMP, a PDA, an MP3 player, or the like.

Although example embodiments have been described with reference to the drawings, the described embodiments may be modified and changed by a person having ordinary knowledge in the relevant technical field without departing from the scope defined in the following claims.

What is claimed is:

1. A display device comprising:
   an insulation layer;
   a wire directly contacting a face of the insulation layer, the wire including an aluminum alloy that includes at least silicon;
   a first electrode overlapping the insulation layer, the first electrode including silver;
   an organic light emitting layer positioned on the first electrode; and
   a second electrode positioned on the organic light emitting layer.

2. The display device of claim 1, wherein:
   the wire includes an aluminum-copper alloy, and
   the aluminum-copper alloy includes copper in a range of 0.2 at % to 3.0 at %.

3. The display device of claim 1, wherein:
   the wire includes an aluminum-copper alloy, and
   the aluminum-copper alloy includes copper in a range of 0.2 at % to 1.0 at %.

4. The display device of claim 1, wherein:
   the wire includes an aluminum-vanadium alloy, and
   the aluminum-vanadium alloy includes vanadium of at most 4.0 at %.

5. The display device of claim 1, further comprising:
   a thin film transistor electrically connected to the first electrode, the thin film transistor including a semiconductor layer, a gate electrode, a source electrode, and a drain electrode.

6. The display device of claim 5, wherein the face of the insulation layer directly contacts each of the source electrode and the drain electrode.

7. The display device of claim 5, further comprising:
   a pad electrode integrally formed with the wire at an end of the wire and wider than the wire in a width direction of the wire.

8. The display device of claim 7, wherein the face of the insulation layer directly contacts each of the source electrode, the drain electrode, and the pad electrode.

9. The display device of claim 1, wherein:
   the wire includes a first layer, a second layer, and a third layer,
   the second layer is positioned between the first layer and the third layer,
   the first layer and the third layer each include titanium, and
   the second layer includes the aluminum alloy.

10. The display device of claim 1, wherein:
    the first electrode includes a first layer, a second layer, and a third layer,
    the second layer is positioned between the first layer and the third layer,
    the first layer and the third layer each include indium tin oxide, and
    the second layer includes the silver.

11. A display device comprising:
    a substrate;
    a wire overlapping the substrate, the wire including an aluminum alloy that includes at least one of gallium, phosphorus, and thallium;
    a first electrode overlapping the substrate and electrically insulated from the wire, the first electrode including silver;
    an organic light emitting layer positioned on the first electrode; and
    a second electrode positioned on the organic light emitting layer.

12. The display device of claim 11, wherein:
    the wire includes an aluminum-indium-gallium-phosphorus-thallium alloy, and
    the aluminum-indium-gallium-phosphorus-thallium alloy includes indium of at most 0.1 at %, gallium of at most 0.2 at %, phosphorus of at most 0.1 at %, and thallium of at most 0.01 at %.

13. A method of manufacturing a display device, the method comprising:
    forming a wire on a substrate, the wire including an aluminum alloy that includes at least silicon;
    forming a first electrode on the substrate, the first electrode including silver;
    forming an organic light emitting layer on the first electrode; and
    forming a second electrode on the organic light emitting layer.

14. The method of claim 13, wherein:
    the wire includes an aluminum-copper alloy, and
    the aluminum-copper alloy includes copper in a range of 0.2 at % to 3.0 at %.

15. The method of claim 13, wherein:
the wire includes an aluminum-copper alloy, and
the aluminum-copper alloy includes copper in a range of 0.2 at % to 1.0 at %.

16. The method of claim 13, wherein:
the wire includes an aluminum-vanadium alloy, and
the aluminum-vanadium alloy includes vanadium of at most 4.0 at %.

17. The method of claim 13, wherein the forming the first electrode includes:
forming a first electrode material layer including silver on a planarization layer; and
etching a portion of the first electrode material layer using an etchant, wherein the planarization layer exposes the wire during the etching.

18. The method of claim 17, wherein:
the first electrode material layer reacts with the etchant to form a silver ion, and
the silver ion directly contacts the wire.

19. The method of claim 18, wherein:
the wire includes a first layer, a second layer, and a third layer,
the second layer is positioned between the first layer and the third layer,
the first layer and the third layer each include titanium, and
the second layer includes the aluminum alloy.

20. The method of claim 19, wherein the silver ion directly contacts a side portion of the second layer of the wire.

* * * * *